(12) United States Patent
Kim et al.

(10) Patent No.: US 11,094,364 B2
(45) Date of Patent: Aug. 17, 2021

(54) DATA STORAGE DEVICE AND OPERATING METHOD THEREOF

(71) Applicant: SK hynix Inc., Gyeonggi-do (KR)

(72) Inventors: Jin Woong Kim, Gyeonggi-do (KR); Ji Hoon Yim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/733,125

(22) Filed: Jan. 2, 2020

(65) Prior Publication Data

US 2020/0176051 A1 Jun. 4, 2020

Related U.S. Application Data

(63) Continuation of application No. 16/032,492, filed on Jul. 11, 2018, now Pat. No. 10,553,270.

(30) Foreign Application Priority Data

Dec. 18, 2017 (KR) ........................ 10-2017-0174249

(51) Int. Cl.
*G11C 7/00* (2006.01)
*G11C 11/406* (2006.01)
(Continued)

(52) U.S. Cl.
CPC ...... *G11C 11/40618* (2013.01); *G06F 3/0619* (2013.01); *G06F 3/0634* (2013.01);
(Continued)

(58) Field of Classification Search
CPC ............ G11C 11/406; G11C 11/40615; G11C 11/40618; G11C 2211/4061; G11C 2211/4067
(Continued)

(56) References Cited

U.S. PATENT DOCUMENTS 5,321,425 A * 6/1994 Chia ........................ G09G 5/39
345/561
7,107,390 B2 * 9/2006 Teng ..................... G06F 11/106
711/105
(Continued)

FOREIGN PATENT DOCUMENTS

KR 10-2012-0028166 A 3/2012
KR 10-2017-0118291 A 10/2017

OTHER PUBLICATIONS

Office Action issued by the USPTO for U.S. Appl. No. 16/736,448 dated Oct. 6, 2020.
(Continued)

*Primary Examiner* — Son T Dinh
(74) *Attorney, Agent, or Firm* — IP & T Group LLP

(57) ABSTRACT

A data storage device includes a nonvolatile memory device including a plurality of memory blocks; and a device controller configured to control the nonvolatile memory device such that, when a first refresh scan command is received from a host device, a first refresh scan operation for the plurality of memory blocks is performed and then a first refresh scan result for the first refresh scan operation is transmitted to the host device, and when a first refresh operation command is received from the host device, a first refresh operation for the nonvolatile memory device is performed.

25 Claims, 5 Drawing Sheets

(51) Int. Cl.
*G11C 16/34* (2006.01)
*G06F 3/06* (2006.01)

(52) U.S. Cl.
CPC ........ *G06F 3/0679* (2013.01); *G11C 16/3418* (2013.01); *G11C 16/3495* (2013.01)

(58) Field of Classification Search
USPC ........................................................ 365/222
See application file for complete search history.

(56) References Cited

U.S. PATENT DOCUMENTS

| | | |
|---|---|---|
| 9,299,455 B2* | 3/2016 | Suzuki ................. G11C 29/028 |
| 2005/0080988 A1 | 4/2005 | Teng |
| 2013/0028034 A1 | 1/2013 | Fujisawa |
| 2016/0070483 A1 | 3/2016 | Yoon et al. |
| 2016/0132253 A1 | 5/2016 | Chiu |
| 2016/0189801 A1 | 6/2016 | Yamaguchi et al. |

OTHER PUBLICATIONS

Office Action issued by the USPTO for U.S. Appl. No. 16/733,140 dated Aug. 6, 2020.

Office Action issued by the Korean Intellectual Property Office dated May 31, 2021.

* cited by examiner

DATA STORAGE DEVICE AND OPERATING METHOD THEREOF

CROSS-REFERENCE TO RELATED APPLICATION

This application is a continuation of U.S. patent application Ser. No. 16/032,492 filed on Jul. 11, 2018, which claims benefits of priority of Korean Patent Application No. 10-2017-0174249 filed on Dec. 18, 2017. The disclosure of each of the foregoing application is incorporated herein by reference in its entirety.

BACKGROUND

1. Technical Field

Various embodiments of the present invention generally relate to a semiconductor device. Particularly, the embodiments relate to a data storage device and an operating method thereof.

2. Related Art

Recently, the paradigm for the computer environment has shifted to ubiquitous computing, which enables computer systems to be used anytime and anywhere. As a result, the use of portable electronic devices such as mobile phones, digital cameras, and laptop computers has rapidly increased. In general, such portable electronic devices use a data storage device which uses a memory device. A data storage device stores data used in a portable electronic device.

Since there is no mechanical driving part, a data storage device using a memory device provides advantages of excellent stability and durability, high information access speed, and low power consumption. Data storage devices having such advantages include a universal serial bus (USB) memory device, memory cards having various interfaces, a universal flash storage (UFS) device, and a solid state drive (SSD).

SUMMARY

Various embodiments are directed to a data storage device with improved operation performance and an operating method thereof.

In an embodiment, a data storage device may include: a nonvolatile memory device including a plurality of memory blocks; and a device controller configured to control the nonvolatile memory device such that, when a first refresh scan command is received from a host device, a first refresh scan operation for the plurality of memory blocks is performed and then a first refresh scan result for the first refresh scan operation is transmitted to the host device and when a first refresh operation command is received from the host device, a first refresh operation for the nonvolatile memory device is performed.

In an embodiment, a method for operating a data storage device may include: performing a first refresh scan operation for each of a plurality of memory blocks in a nonvolatile memory device in response to a first refresh scan command transmitted from a host device; transmitting a first refresh scan result for the first refresh scan operation to the host device; and performing a first refresh operation for the nonvolatile memory device in response to a first refresh operation command transmitted from the host device.

In an embodiment, a nonvolatile memory system include: a nonvolatile memory device including memory blocks; and a controller configured to control the nonvolatile memory device to perform a background refresh operation when one or more of the memory blocks meet a set condition; and control the nonvolatile memory device to perform a foreground refresh operation in response to a refresh request provided from a host. The controller provides the host with conditions of the memory blocks in response to a scan request provided from the host.

According to the embodiments, a refresh operation may be performed in advance during a time in which a data storage device is not used by a user or when a refresh is requested from the user. As a result, it is possible to prevent the operation performance of the data storage device from degrading while the data storage device is used by the user.

Also, since a refresh operation for a nonvolatile memory device may be performed at an appropriate time, the reliability of the data storage device may be improved.

DETAILED DESCRIPTION

Figure 1:
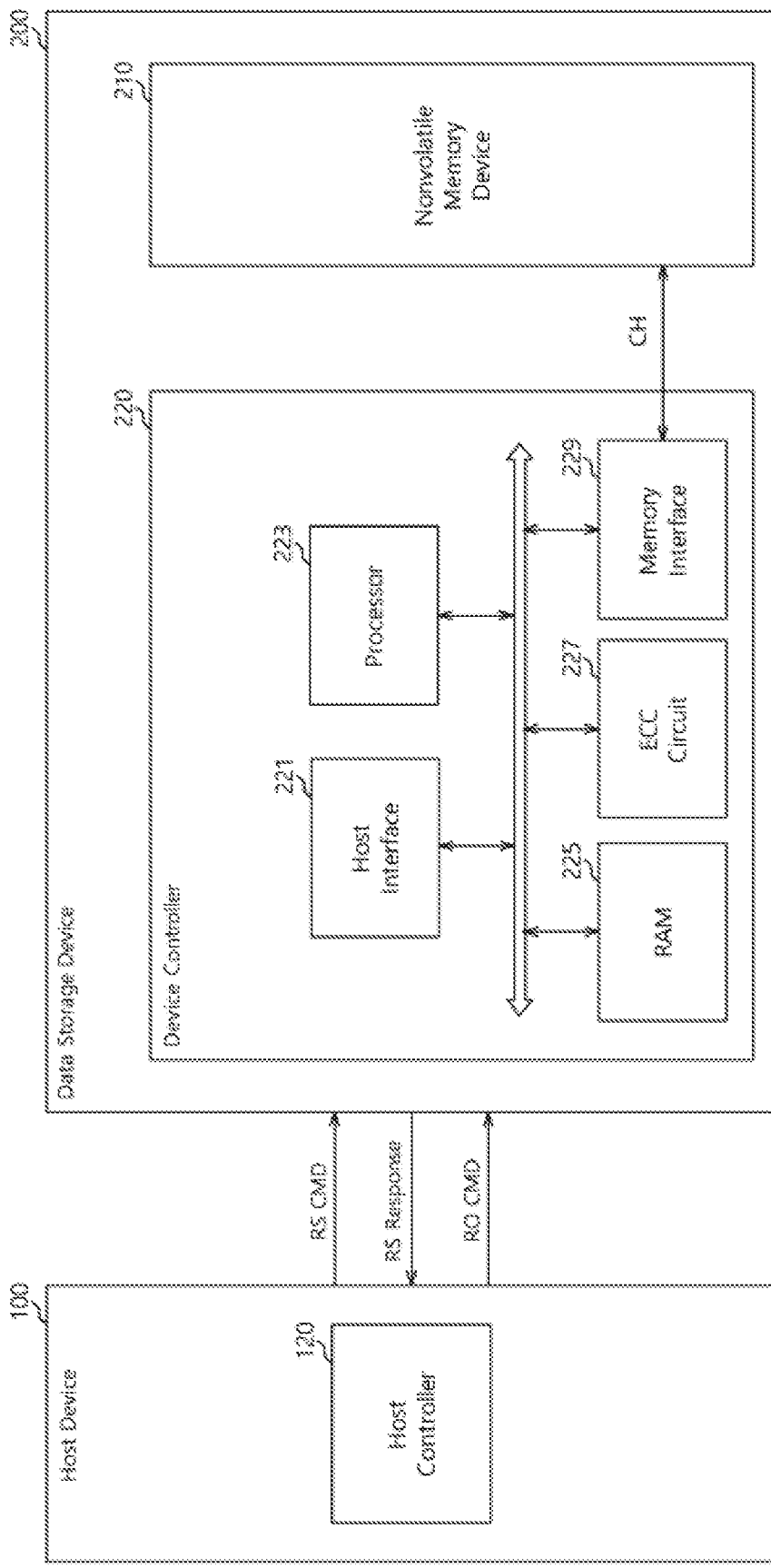
FIG. 1 is a block diagram illustrating an exemplary configuration of a memory system including a data storage device according to an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it is will also be understood that when an element is referred to as being "between" two elements, it may be the only element between the two elements, or one or more intervening elements may also be present.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

The terminology used herein is for the purpose of describing particular embodiments only and is not intended to be limiting of the present invention.

A data storage device and an operating method thereof are described below with reference to the accompanying drawings through various embodiments.

FIG. 1 is a block diagram illustrating an exemplary configuration of a memory system 10 including a data storage device 200 according to an embodiment of the present disclosure.

Referring to FIG. 1, the memory system 10 may include a host device 100 and the data storage device 200.

The host device 100 may include devices such as a mobile phone, an MP3 player, a laptop computer, a desktop computer, a game player, a TV and an in-vehicle infotainment system, but the host device 100 is not specifically limited any of these devices or systems.

The host device 100 may include a host controller 120 for controlling the general operations of the host device 100. While not shown in FIG. 1, the host device 100 may include an interface for interfacing with the data storage device 200. The host controller 120 may transmit various commands to the data storage device 200. For example, the host controller 120 may transmit commands, such as a read command and a program command, to the data storage device 200. The host controller 120 may transmit information on an address to read or program to the data storage device 200.

In the present embodiment, the host controller 120 may transmit a refresh scan command RS CMD and a refresh operation command RO CMD to the data storage device 200.

The refresh scan command RS CMD may be a command for checking whether t is necessary to perform a refresh operation for a nonvolatile memory device 210 of the data storage device 200 and the degree of urgency. If the refresh scan command RS CMD is transmitted from the host device 100, a device controller 220 of the data storage device 200 may perform a refresh scan operation of checking the number of failed bits, a read count and an erase count for each of the plurality of memory blocks (one of which is shown) in the nonvolatile memory device 210. For of convenience, a passive refresh scan operation performed in the data storage device 200 in response to the refresh scan command RS CMD transmitted from the host device 100 will be referred to as a first refresh scan operation, and a passive refresh operation performed based on a first refresh scan result will be referred to as a first refresh operation.

The host controller 120 may receive a refresh scan result RS Response transmitted from the data storage device 200, and may transmit the refresh operation command RO CMD to the data storage device 200 based on the refresh scan result RS Response. The host controller 120 may transmit the refresh operation command RO CMD when the data storage device 200 is not used by a user or when a refresh request is inputted from the user, based on the refresh scan result RS Response transmitted from the data storage device 200.

The data storage device 200 may store data to be accessed by the host device 100. The data storage device 200 may be configured as any one of various kinds of storage devices depending on a transmission protocol with the host device 100. For example, the data storage device 200 may be configured as any one of a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The data storage device 200 may be manufactured as any one of various package types. For example, the data storage device 200 may be manufactured as any one of a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 200 may include the nonvolatile memory device 210 and the device controller 220.

The nonvolatile memory device 210 may operate as the storage medium of the data storage device 200. The nonvolatile memory device 210 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on memory cells.

The nonvolatile memory device 210 may include a memory cell array (not shown) which has a plurality of memory cells respectively disposed at regions where a plurality of bit lines and a plurality of word lines intersect with each other. The memory cell array may include a plurality of memory blocks, and each of the plurality of memory blocks may include a plurality of pages.

Each memory cell of the memory cell array may be a single level cell (SLC) storing one bit, a multi-level cell (MLC) capable of storing 2-bit data, a triple level cell (TLC) capable of storing 3-bit data or a quad level cell (QLC) capable of storing 4-bit data. The memory cell array may include single level cells, multi-level cells, triple level cells and/or quad level cells. For example, the memory cell array may include memory cells of a 2-dimensional horizontal structure or memory cells of a 3-dimensional vertical structure.

A read operation and a program operation for the nonvolatile memory device 210 may be performed on a unit such as a page, and an erase operation may be performed on a unit such as a memory block.

The device controller 220 may include a host interface 221, a processor 223, a RAM 225, an error correction code (ECC) circuit 227 and a memory interface 229.

The host interface 221 may interface the host device 100 and the data storage device 200. For example, the host interface 221 may communicate with the host device 100 by using any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 223 may be configured by a micro control unit (MCU) or a central processing unit (CPU). The processor 223 may process the command received from the host device 100. In order to process the command received from the host device 100, the processor 223 may drive an instruction or algorithm of a code type, that is, a software, loaded in the RAM 225, and may control internal function blocks and the nonvolatile memory device 210.

The RAM 225 may be configured by a random access memory such as a dynamic random access memory (DRAM) or a static random access memory (SRAM). The RAM 225 may store a software to be driven by the processor 223. Also, the RAM 225 may store data necessary for the driving of the software (for example, metadata). Namely, the RAM 225 may operate as the working memory of the processor 223.

The RAM 225 may temporarily store data to be transmitted from the host device 100 to the nonvolatile memory device 210 or data to be transmitted from the nonvolatile memory device 210 to the host device 100. In other words, the RAM 225 may operate as a data buffer memory or a data cache memory.

The ECC circuit 227 may perform an ECC encoding operation of generating the parity data of data to be transmitted from the host device 100 to the nonvolatile memory device 210. The ECC circuit 227 may perform an ECC decoding operation of detecting and correcting an error for the data read out from the nonvolatile memory device 210, based on corresponding parity data. When the number of error bits in the data read out from the nonvolatile memory device 210 is equal to or less than a set or predetermined number of bits (for example, error correction capability), the ECC circuit 227 may correct the detected error bits.

The memory interface 229 may control the nonvolatile memory device 210 according to the control of the processor 223. The memory interface 229 may also be referred to as a memory controller. The memory interface 229 may provide control signals to the nonvolatile memory device 210. The control signals may include a command, an address and the like, for controlling the nonvolatile memory device 210. The memory interface 229 may provide data to the nonvolatile memory device 210 or may be provided with data from the nonvolatile memory device 210. The memory interface 229 may be coupled with the nonvolatile memory device 210 through a channel CH including one or more signal lines.

The processor 223 may perform refresh operations such as garbage collection, wear leveling and read reclaim to improve the operation performance of the nonvolatile memory device 210. For convenience, an active refresh scan operation of determining, by the device controller 220 of the data storage device 200, whether it is necessary to perform a refresh operation will be referred to as a second refresh scan operation, and an active refresh operation to be performed based on a second refresh scan result will be referred to as a second refresh operation.

That is to say, the processor 223 of the device controller 220 of the data storage device 200 according to the present embodiment may perform the passive refresh scan operation and the passive refresh operation in response to the refresh scan command RS CMD and the refresh operation command RO CMD transmitted from the host device 100 or perform the active refresh scan operation and the active refresh operation according to a set or predetermined condition in the absence of the refresh scan command RS CMD and the refresh operation command RO CMD respectively.

In the present embodiment, a read reclaim operation and a wear leveling operation among refresh operations will be described as examples, but the same principle may be applied to other kinds of refresh operations.

The memory cells of the nonvolatile memory device 210 may wear out as a result of erase operations and program operations being performed repeatedly. Worn-out memory cells may cause failures in the memory device 210 (for example, physical defects). Wear-leveling is an operation of leveling the program-erase counts of respective memory blocks, that is, an operation of causing all the memory blocks in the nonvolatile memory device 210 to have similar wear levels, to prevent any memory block from being worn out faster than the other memory blocks. Wear-leveling may be performed by moving the data stored in a memory block of which the program-erase count has reached a set or predetermined threshold count, to a memory block which has a program-erase count lower than the threshold count.

The data stored in each of the memory blocks of the nonvolatile memory device 210 may be influenced by read disturbance each time a read operation is performed for each of the memory blocks, and may be damaged as a result, particularly in the case where the read operation is performed excessively. The device controller 220 may manage read count of each memory block, and may recover the damaged data of a corresponding memory block by performing read reclaim for the memory block of which the read count has reached a set or predetermined threshold count. Read reclaim may be performed by detecting and correcting an error by reading the data stored in a memory block of which read count has reached the set or predetermined threshold count and by storing the error-corrected data in another memory block.

The processor 223 may use different threshold counts in the first refresh scan operation that is performed according to the request of the host device 100 and the second refresh scan operation that is performed as determined by the processor 223. For example, the processor 223 may use a first threshold count in the first refresh scan operation and may use a second threshold count in the second refresh scan operation. The first threshold count may be less than the second threshold count.

The first refresh scan result may include a failed bit count, a read count and a program-erase count for each memory block. The first threshold count may include a first threshold failed bit count, a first threshold read count and a first threshold program-erase count.

The processor 223 may determine whether it is necessary to perform the first refresh operation and the degree of urgency, for each memory block, based on a comparison result of the first refresh scan result for each memory block of the nonvolatile memory device 210 and the first threshold count, and may transmit a determination result to the host device 100, as a refresh scan result for the nonvolatile memory device 210. The determination result may be indicative of a normal state, a low state or a high state, but it is to be noted that the determination result is not specifically limited thereto. The normal state may be a state in which a refresh operation for the nonvolatile memory device 210 is not necessary. The low state may be a state in which a refresh operation for the nonvolatile memory device 210 is necessary but need not be performed urgently. The high state may mean a state in which a refresh operation for the nonvolatile memory device 210 is necessary and need be performed urgently.

The host device 100 may transmit or not transmit the refresh operation command RO CMD to the processor 223 based on the refresh scan result transmitted from the processor 223.

As described above, the processor 223 performs by its own determination a refresh operation, that is, the second refresh operation, for the nonvolatile memory device 210 even without a request from the host device 100. The processor 223 may continuously perform the second refresh scan operation for the nonvolatile memory device 210. The second refresh scan operation may include an operation of checking a read count or a program-erase count for each of the memory blocks of the nonvolatile memory device 210. The second refresh scan result may include a read count and a program-erase count for each memory block. The second threshold count may include a second threshold read count and a second threshold program-erase count.

The processor 223 may determine whether a memory block of which the read count or the program-erase count is greater than the second threshold count exists among the memory blocks of the nonvolatile memory device 210. If such a memory block does not exist, the processor 223 may not perform a refresh operation for the nonvolatile memory device 210. If at least one such memory block exists, the processor 223 may perform a refresh operation for the nonvolatile memory device 210.

Figure 2:
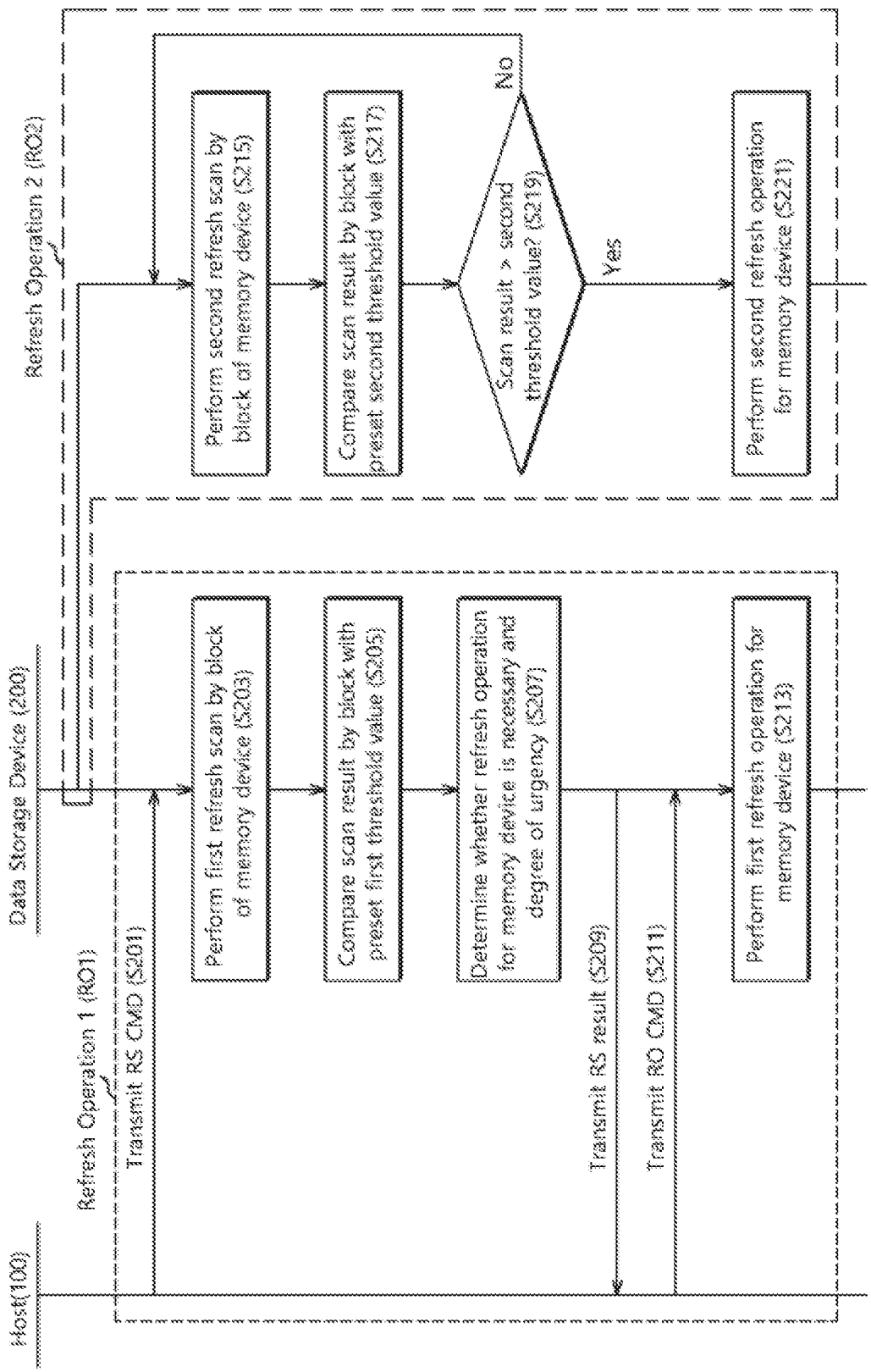
FIG. 2 is a flow chart describing a method for operating a data storage device according to an embodiment of the present disclosure.

FIG. 2 is a flow chart describing a method for operating the data storage device 200 in accordance with an embodiment. In explaining the method for operating the data storage device 200 in accordance with the embodiment, with reference to FIG. 2, reference also may be made to FIG. 1.

The method for operating the data storage device 200 in accordance with the embodiment may include a first refresh operation (Refresh Operation 1) RO1 that is passively performed according to the request of the host device 100 and a second refresh operation (Refresh Operation 2) RO2 that is actively performed based on a reference set or predetermined in the data storage device 200.

Steps S201 to S213 of FIG. 2 represent the first refresh operation RO1.

At step S201, the host controller 120 of the host device 100 may transmit a refresh scan command RS CMD to the data storage device 200. The host device 100 may transmit the refresh scan command RS CMD to the data storage device 200 when the data storage device 200 is in a standby state in which a user does not use the data storage device 200 or if a refresh operation request for a memory is inputted from the user, but it is to be noted that the embodiment is not specifically limited thereto.

At step S203, the processor 223 of the device controller 220 of the data storage device 200 may perform a first refresh scan operation for the plurality of memory blocks (not shown) in the nonvolatile memory device 210. The first refresh scan operation may include checking the count of failed bits in the data stored in each memory block, a read count for each memory block and a program-erase count for each memory block.

At step S205, the processor 223 may compare a first refresh scan result with a set or predetermined first threshold count. The first refresh scan result may include a failed bit count, a read count and a program-erase count for each memory block. The set or predetermined first threshold count may include a first threshold failed bit count, a first threshold read count and a first threshold program-erase count.

The processor 223 may compare a failed bit count, a read count and a program-erase count for each of all the memory blocks in the nonvolatile memory device 210 with the first threshold failed bit count, the first threshold read count and the first threshold program-erase count, respectively.

At step S207, the processor 223 may determine whether it is necessary to perform a first refresh operation and the degree of urgency, for each memory block, based on a comparison result of the first refresh scan result of each memory block and the first threshold count. Whether it is necessary to perform a first refresh operation may mean whether it is necessary to perform a first refresh operation for a corresponding memory block. The degree of urgency of the first refresh operation may mean a point of time at which the first refresh operation is to be performed for the corresponding memory block.

For example, if a memory block of which first refresh scan result is greater than the first threshold count does not exist among the memory blocks of the nonvolatile memory device 210, the processor 223 may determine a normal state in which it is not necessary to perform the first refresh operation. If memory blocks of which first refresh scan results are greater than the first threshold count, among the memory blocks of the nonvolatile memory device 210 are less than a first percentage, the processor 223 may determine a low state in which it is necessary to perform the first refresh operation but need not be performed in an urgent basis. If memory blocks of which first refresh scan results are greater than the first threshold count, among the memory blocks of the nonvolatile memory device 210 are equal to or greater the first percentage and less than a second percentage, the processor 223 may determine a high state in which it is necessary to perform the first refresh operation and need be performed in an urgent basis. For example, the first percentage may be 5% of the memory blocks in the nonvolatile memory device 210 and the second percentage may be 10% of the memory blocks in the nonvolatile memory device 210, but it is to be noted that the embodiment is not specifically limited thereto.

At step S209, the processor 223 may transmit a first refresh scan result to the host device 100. The processor 223 may transmit the first refresh scan result to the host device 100, as the normal state, the low state or the high state.

At step S211, the host device 100 may transmit or not transmit a first refresh operation command RO CMD to the processor 223 based on the first refresh scan result transmitted from the processor 223. If the normal state is received from the processor 223, the host device 100 may not transmit the first refresh operation command RO CMD to the processor 223. If the low state or the high state is received from the processor 223, the host device 100 may transmit the first refresh operation command RO CMD to the processor 223.

The host device 100 may transmit the first refresh operation command RO CMD to the data storage device 200 immediately when the first refresh scan result is received from the processor 223. Alternatively, the host device 100 may not transmit the first refresh operation command RO CMD to the data storage device 200 immediately when the first refresh scan result is received from the processor 223, and may transmit the first refresh operation command RO CMD to the data storage device 200 at an appropriate point of time. The appropriate point of time may be a point of time at which the data storage device 200 is not used by a user or a point of time at which a refresh operation is requested by the user's manipulation, but it is to be noted that the embodiment is not specifically limited thereto.

At step S213, if the first refresh operation command RO CMD is transmitted from the host device 100, the processor 223 may perform the first refresh operation for the nonvolatile memory device 210.

Steps S215 to S221 of FIG. 2 represent the second refresh operation RO2.

At step S215, the processor 223 of the device controller 220 of the data storage device 200 may perform a second refresh scan operation for the memory blocks of the nonvolatile memory device 210. The second refresh scan operation may be a scan operation for the memory blocks that is performed by the determination of the processor 223 regardless of the refresh scan command RS CMD transmitted from the host device 100. The second refresh scan operation may include an operation of checking a read count or a program-erase count for each of the memory blocks of the nonvolatile memory device 210.

At step S217, the processor 223 may compare read counts or program-erase counts for the memory blocks of the nonvolatile memory device 210 with a set or predetermined second threshold count (for example, a second threshold read count or a second threshold program-erase count). The second threshold count used at the present step may be greater than the first threshold count used at the step S205 of the first refresh operation RO1.

At step S219, the processor 223 may determine whether a memory block of which read count or program-erase count is greater than the second threshold count exists among the memory blocks of the nonvolatile memory device 210. If a memory block of which read count or program-erase count is greater than the second threshold count does not exist, the process may proceed to the step S215. If a memory block of which read count or program-erase count is greater than the second threshold count exists, the process may proceed to step S221.

At step S221, the processor 223 may perform a second refresh operation for the nonvolatile memory device 210 regardless of the refresh operation command RO CMD transmitted from the host device 100. For example, if a memory block of which read count is greater than the second threshold read count exists, the processor 223 may perform read reclaim as the second refresh operation for the nonvolatile memory device 210. If a memory block of which program-erase count is greater than the second threshold program-erase count exists, the processor 223 may perform wear leveling as the second refresh operation for the nonvolatile memory device 210.

In the present embodiment, the first refresh operation according to the request of the host device 100 may be performed based on the percentage of memory blocks of which read counts and/or program-erase counts are greater than the first threshold count, among the memory blocks in the nonvolatile memory device 210. Conversely, the second refresh operation according to the determination of the data storage device 200 may be performed when there exists at least one memory block of which read count and/or program-erase count is greater than the second threshold count, among the memory blocks in the nonvolatile memory device 210.

Since the first threshold count used in the first refresh operation to be performed according to the request of the host device 100 is less than the second threshold count used in the second refresh operation to be performed by the determination of the data storage device 200, a refresh operation may be performed in advance, such as when a user is not using the data storage device 200 or when a refresh is requested from the user. As a result, it is possible to prevent the operation performance of the data storage device 200 from degrading while the data storage device 200 is used by the user.

Also, since a refresh operation for the nonvolatile memory device 210 may be performed at an appropriate time, the reliability of the data storage device 200 may be improved.

Figure 3:
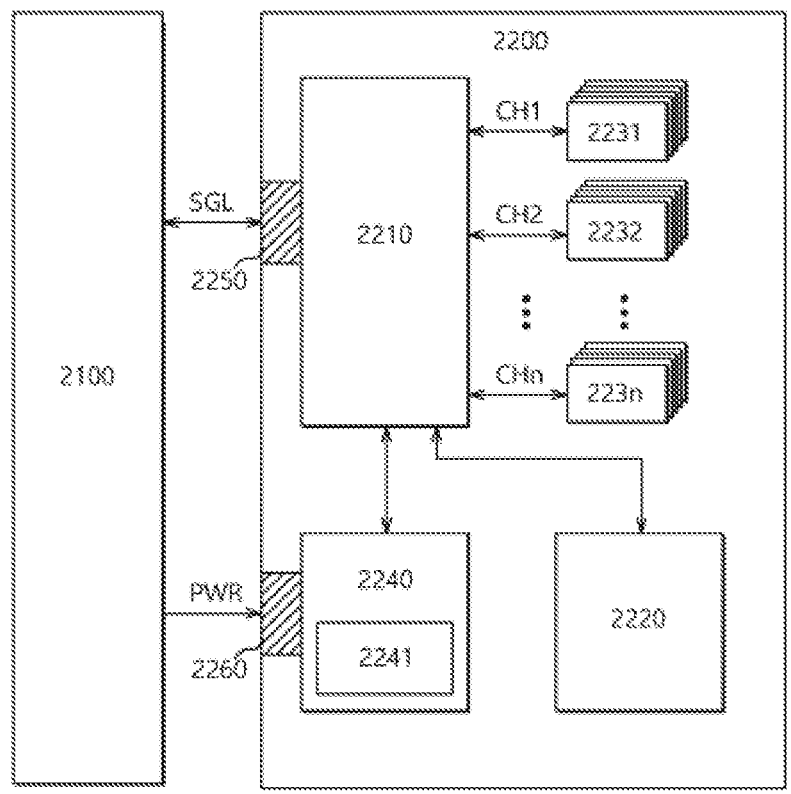
FIG. 3 is a diagram illustrating an example of a data processing system including a solid state drive (SSD) according to an embodiment of the present disclosure.

FIG. 3 is a diagram illustrating an example of a data processing system including a solid state drive (SSD) according to an embodiment. Referring to FIG. 3, a data processing system 2000 may include a host apparatus 2100 and an SSD 2200.

The SSD 2200 may include a controller 2210, a buffer memory device 2220, non-volatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured as any of various types of connectors according to an interfacing method between the host apparatus 2100 and the SSD 2200.

Figure 4:
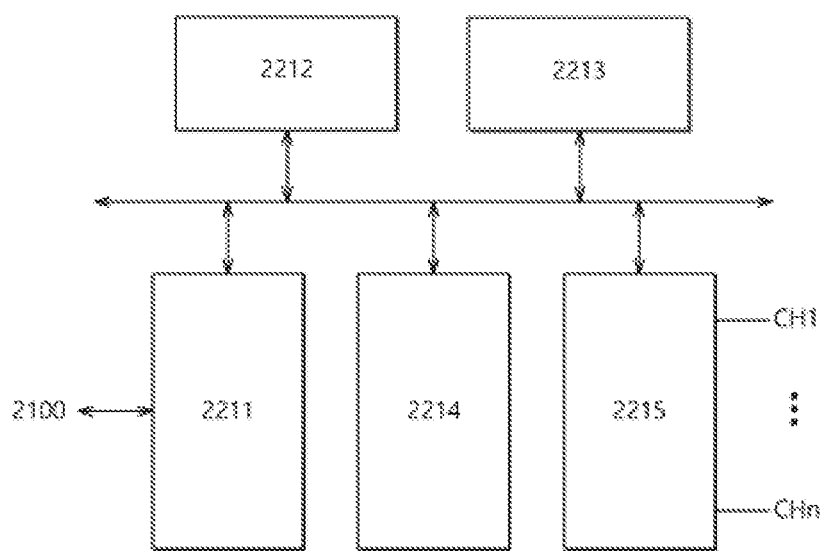
FIG. 4 is a diagram illustrating an example of a controller illustrated in FIG. 3.

FIG. 4 is a diagram illustrating an example of the controller 2210 of FIG. 3. Referring to FIG. 4, the controller 2210 may include a host interface 2211, a control component 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATH) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface 2211 may perform a disc emulation function that the host apparatus 2100 recognizes the SSD 2200 as a general-purpose data storage apparatus, for example, a hard disc drive HDD.

The control component 2212 may analyze and process the signal SGL input from the host apparatus 2100. The control component 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 5:
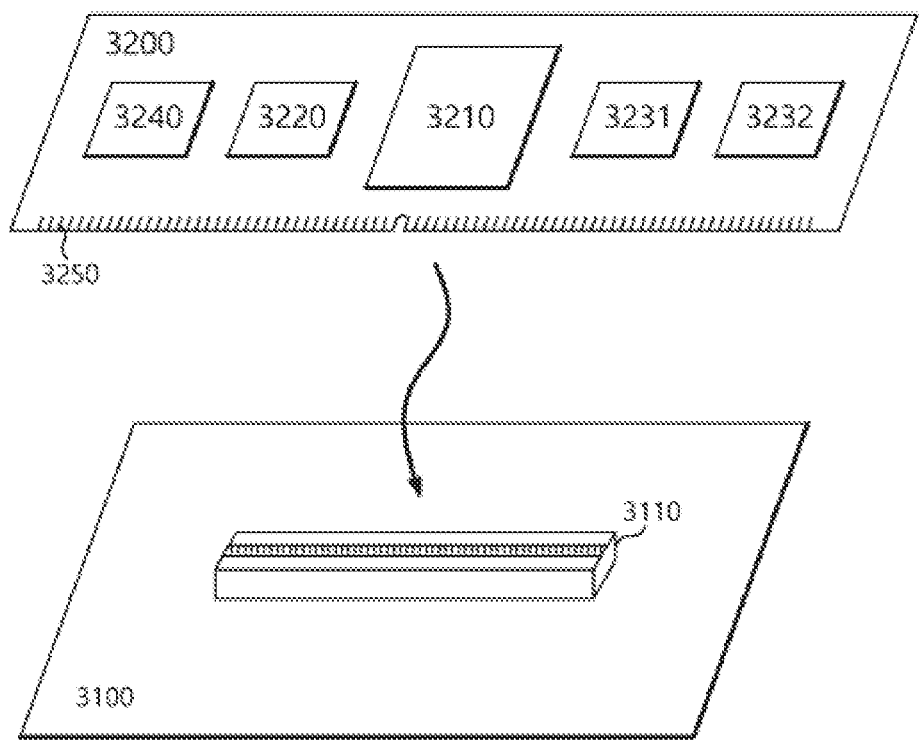
FIG. 5 is a diagram illustrating an example of a data processing system including a data storage apparatus according to an embodiment of the present disclosure.

FIG. 5 is a diagram illustrating an example of a data processing system including a data storage apparatus according to an embodiment. Referring to FIG. 5, a data processing system 3000 may include a host apparatus 3100 and a data storage apparatus 3200.

The host apparatus 3100 may be configured in a board form such as a printed circuit board (PCB). Although not shown in FIG. 5, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may be embodied as a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 4.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 6:
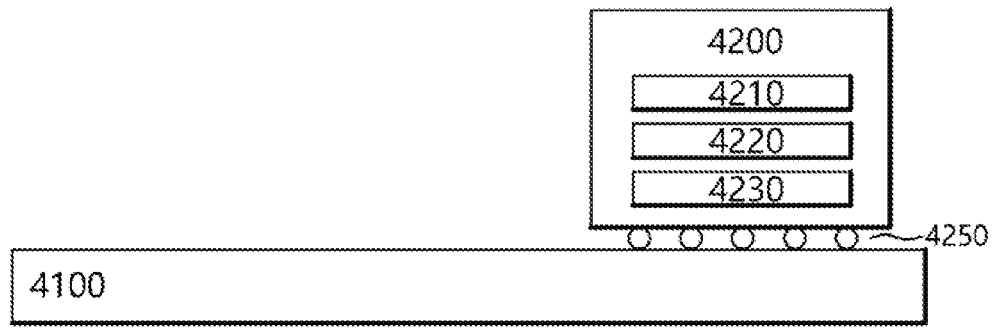
FIG. 6 is a diagram illustrating an example of a data processing system including a data storage apparatus according to an embodiment of the present disclosure.

FIG. 6 is a diagram illustrating an example of a data processing system including a data storage apparatus according to an embodiment. Referring to FIG. 6, a data processing system 4000 may include a host apparatus 4100 and a data storage apparatus 4200.

The host apparatus 4100 may be configured in a board form such as a PCB. Although not shown in FIG. 6, the host apparatus 4100 may include internal functional blocks configured to perform functions of the host apparatus 4100.

The data storage apparatus 4200 may be configured in a surface mounting package form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 4.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 7:
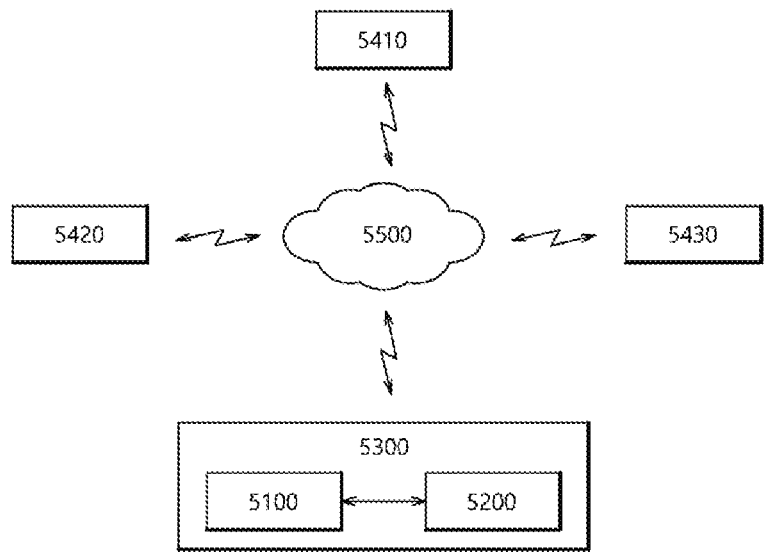
FIG. 7 is a diagram illustrating an example of a network system including a data storage apparatus according to an embodiment of the present disclosure.

FIG. 7 is a diagram illustrating an example of a network system 5000 including a data storage apparatus according to an embodiment. Referring to FIG. 7, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 3, the data storage apparatus 3200 of FIG. 5, or the data storage apparatus 4200 of FIG. 6.

Figure 8:
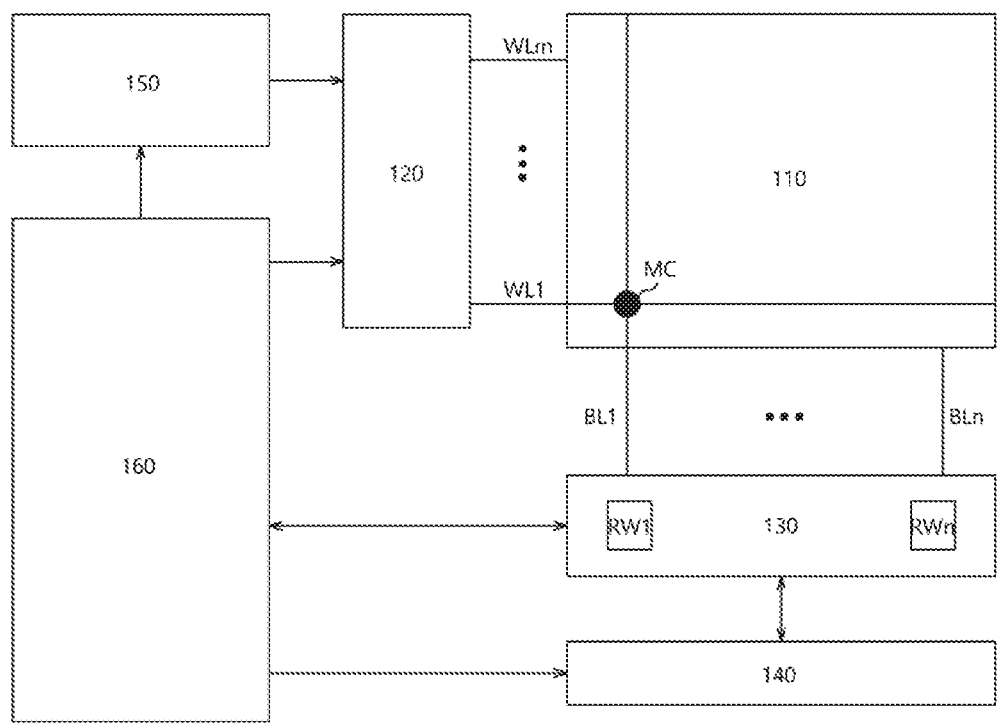
FIG. 8 is a block diagram illustrating an example of a nonvolatile memory device included in a data storage apparatus according to an embodiment of the present disclosure.

FIG. 8 is a block diagram illustrating an example of a nonvolatile memory device in a data storage apparatus according to an embodiment. Referring to FIG. 8, a nonvolatile memory device 100 may include a memory cell array 110, a row decoder 120, a column decoder 140, a data read/write block 130, a voltage generator 150, and a control logic 160.

The memory cell array 110 may include memory cells MC arranged in regions in which word lines WL1 to WLm and bit lines BL1 to BLn intersect.

The row decoder 120 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

The above embodiments of the present disclosure are illustrative, but the present invention is not limited to the disclosed embodiments. Various alternatives and equivalents are possible and are not limited by the embodiments described herein. Nor is the present disclosure limited to any specific type of semiconductor device. Other additions, subtractions, or modifications apparent to those skilled in the art in view of the present disclosure are intended to fall within the scope of the appended claims.

What is claimed is:

1. A data storage device comprising:
   a nonvolatile memory device including a memory block; and
   a device controller configured to receive a refresh scan command requesting information related to the memory block from a host device,
   wherein the information indicates necessity and urgency of performing a refresh operation for the nonvolatile memory device.

2. A data storage device comprising:
   a nonvolatile memory device including a memory block; and
   a device controller configured to perform a refresh scan operation by reading information related to the memory block,
   wherein the information related to the memory block includes at least one of a read count, an erase count, a program count, or a failed bit count.

3. The data storage device according to claim 2, wherein the refresh scan operation is triggered by a command received from a host device.

4. The data storage device according to claim 2, wherein the device controller acquires the information related to the memory block from the nonvolatile memory device.

5. A data storage device comprising:
   a nonvolatile memory device including a memory block; and
   a device controller configured to transmit a result of a refresh scan operation to a host device,
   wherein the result indicates a degree of urgency of performing a refresh operation for the nonvolatile memory device.

6. The data storage device according to claim 5, wherein the result includes one of a plurality of states of the memory block.

7. The data storage device according to claim 5, wherein the result indicates information related to a reliability of data stored in the nonvolatile memory device.

8. The data storage device according to claim 5, wherein the result indicates information related to at least one of a read count, an erase count, a program count, and a failed bit count.

9. The data storage device according to claim 5, wherein the host device decides whether the host device sends a command activating data transfer within the nonvolatile memory device to the device controller based on the result.

10. A data storage device comprising:
    a nonvolatile memory device including memory blocks; and
    a device controller configured to receive a refresh command, which is a command for transferring data from one memory block to another memory block, from a host device.

11. The data storage device according to claim 10, wherein the refresh command activates at least one operation of a garbage collection operation, a wear leveling operation, and a read reclaim operation.

12. The data storage device according to claim 10, wherein the refresh command prevents degrading data transfer performance by reducing a number of an operation not requested by a user.

13. The data storage device according to claim 12, wherein the operation not requested by the user is counted during a predetermined time.

14. A data storage device comprising:
a nonvolatile memory device including memory blocks; and
a device controller configured to perform a refresh operation to transfer data from one memory block to another memory block in background.

15. The data storage device according to claim 14, wherein the refresh operation includes at least one operation of a garbage collection operation, a wear leveling operation, and a read reclaim operation.

16. The data storage device according to claim 14, wherein the refresh operation is triggered when the one memory block meets a set condition.

17. A data storage device comprising:
a nonvolatile memory device including memory blocks; and
a device controller configured to perform a refresh operation to transfer data from one memory block to another memory block in foreground.

18. The data storage device according to claim 17, wherein the refresh operation is performed in response to a command from a host device.

19. A data storage device comprising:
a nonvolatile memory device including memory blocks; and
a device controller configured to activate one of a background refresh operation and a foreground refresh operation,
wherein each of the background refresh operation and the foreground refresh operation is an operation for transferring data from one memory block to another memory block.

20. The data storage device according to claim 19, wherein the background refresh operation is activated by a predetermined condition.

21. The data storage device according to claim 19, wherein the foreground refresh operation is activated by a command form a host device.

22. A memory system comprising:
a host device; and
a data storage device configured to include memory blocks and perform operations according to commands received from the host device,
wherein the data storage device performs a foreground refresh operation for a nonvolatile memory device in response to a refresh command, which is a command for transferring data from one memory block to another memory block, received from the host device.

23. The memory system according to claim 22, wherein the data storage device performs a background refresh operation when the one memory block meets a set condition.

24. The memory system according to claim 22, wherein the foreground refresh operation includes scanning each of the memory blocks, transmitting a scan result of each of the memory blocks to the host device, and transferring the data from the one memory block to the another memory block.

25. The memory system according to claim 24, wherein the refresh command includes a refresh scan command and a refresh operation command, and
wherein the host device transmits the refresh operation command to the data storage device based on the scan result.

* * * * *